(12) United States Patent
Kim

(10) Patent No.: US 7,604,905 B2
(45) Date of Patent: Oct. 20, 2009

(54) PHOTOMASKS

(75) Inventor: Hong Lae Kim, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 957 days.

(21) Appl. No.: 11/026,486

(22) Filed: Dec. 29, 2004

(65) Prior Publication Data

US 2005/0153218 A1 Jul. 14, 2005

(30) Foreign Application Priority Data

Dec. 31, 2003 (KR) .................. 10-2003-0101206

(51) Int. Cl.
*G03F 1/00* (2006.01)
(52) U.S. Cl. ......................................... 430/5
(58) Field of Classification Search ............ 430/5, 430/394; 250/492.2, 492.22; 438/275
See application file for complete search history.

(56) References Cited

U.S. PATENT DOCUMENTS

| | | | | |
|---|---|---|---|---|
| 5,858,580 A | | 1/1999 | Wang et al. | 430/5 |
| 5,989,756 A | * | 11/1999 | Nakae | 430/5 |
| 6,406,818 B1 | | 6/2002 | Zemen et al. | 430/5 |
| 6,828,068 B2 | | 12/2004 | Progler et al. | 430/5 |

FOREIGN PATENT DOCUMENTS

| | | |
|---|---|---|
| KR | 10-2002-0090487 | 12/2002 |
| WO | WO 03/054626 A1 | 7/2003 |

* cited by examiner

*Primary Examiner*—Stephen Rosasco
(74) *Attorney, Agent, or Firm*—Saliwanchik, Lloyd & Saliwanchik

(57) ABSTRACT

Photomasks are disclosed. A disclosed example photomask comprises: a first pattern located along an axis of the photomask; at least one second pattern located a distance from and a predetermined angle to the first pattern; and slits made of Cr on at least one end of each of the first and second patterns, wherein the photomask is a Cr-less mask.

3 Claims, 2 Drawing Sheets

PHOTOMASKS

FIELD OF THE DISCLOSURE

The present disclosure relates to photomasks and, more particularly, to photomasks of the Cr-less type having a shadow pattern comprising a slit made of Cr.

BACKGROUND

FIG. 1 illustrates a prior art photomask having a shadow pattern as described in Korean Patent Publication No. 2002-0090487, which is hereby incorporated by reference in its entirety. The photomask 200 of FIG. 1 has a shadow pattern 210. The photomask 200 comprises a low density pattern region 202 having a low ratio of pattern areas 201 per unit area, a high density pattern region 203 having a high ratio of pattern areas 201 per unit area, and an interface 205 between the low density pattern region 202 and the high density pattern region 203. The shadow pattern 210 is positioned in the interface 205 and includes a slit having a width (w) which will not pass light from a predetermined light source.

If the light source is an excimer laser, the shadow pattern 210 preferably has a width (w) less than 40 nm so that it will not pass light from the excimer laser source. The width (w) is determined by the type of the light source. For example, the shorter the wavelength of the light source, the narrower the width. The shadow pattern 210 functions as a barrier that prevents light from a light source to which the low density pattern region 202 is exposed from interfering with the high density pattern region 203. Therefore, the problem that the high density pattern region 203 is changed in terms of its shape or formed in an unintended region by interference from the light source for the low density pattern region 202 may be solved. Furthermore, since the shadow pattern 210 can be simultaneously formed with the pattern 201 during a photomask fabricating process, conventional equipment and methods for exposure may be advantageously utilized to form the shadow pattern 210 without any additional effort. As a result, the method as described above is cost-effective.

Widely used prior art masks include a binary mask comprising quartz and Cr, a half tone phase shift mask comprising quartz, Cr and MoSiN, and a Cr-less mask capable of improving a mask resolution by changing the phase of the quartz. The half tone phase shift mask is more advantageous than the binary mask in terms of resolution and process margin. Consequently, the half tone phase shift mask has been widely used in the critical lithography process for obtaining a 0.13 μm linewidth or a 0.09 μm linewidth. KrF (248 nm exposure wavelength) lithography equipment can form a pattern having a gate line with a 0.13 μm linewidth or a contact hole with a 0.16 μm linewidth. However, for a pattern having a linewidth less than 0.13 μm, KrF lithography has difficulties in ensuring a sufficient process margin or even forming the pattern itself. Thus, ArF (193 nm exposure wavelength) lithography or alternative methods are required to solve the problem. On the other hand, the Cr-less mask can improve the mask resolution, but cannot be formed as a pattern which has an entire region free of Cr. Accordingly, it is unsuitable for commercial use. Moreover, known Cr-less masks are also disadvantageous in that unintended patterns are formed in the transition region where the phase of the light source shifts from 0 degrees to 180 degrees.

DETAILED DESCRIPTION

Figure 1:
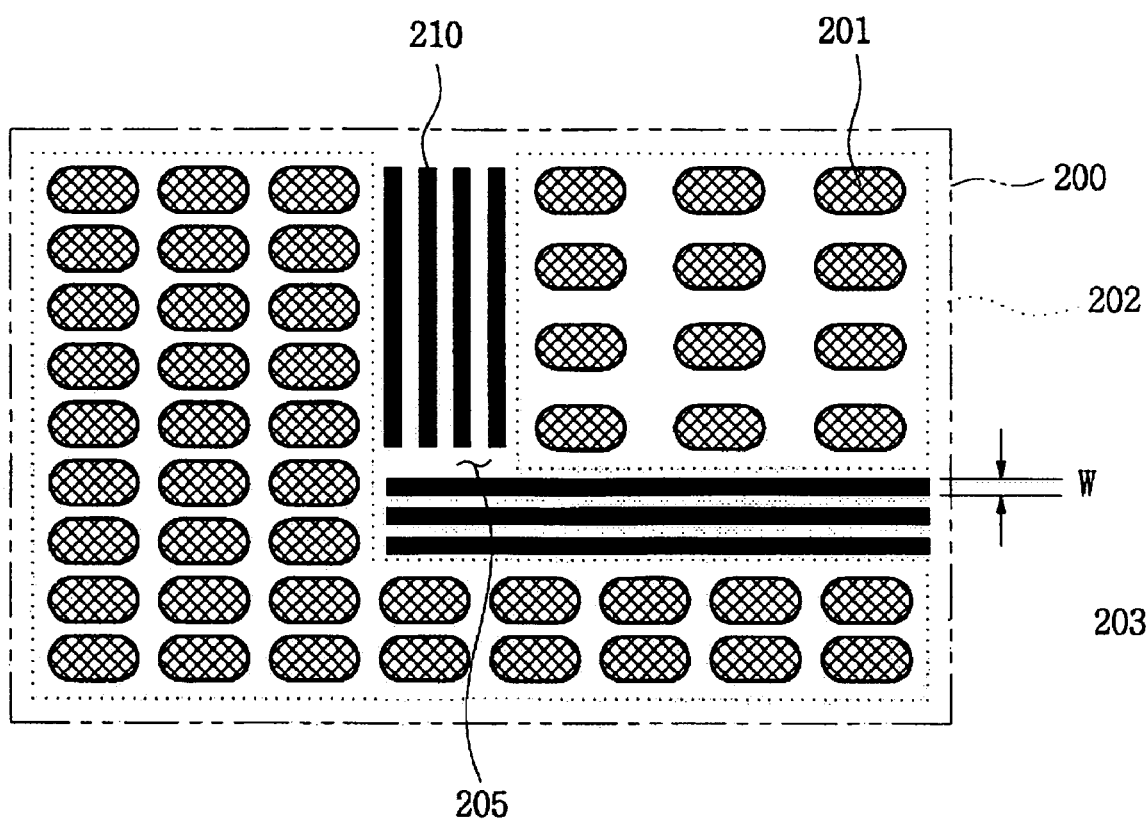
FIG. 1 illustrates a prior art photomask having a shadow pattern.
Figure 2:
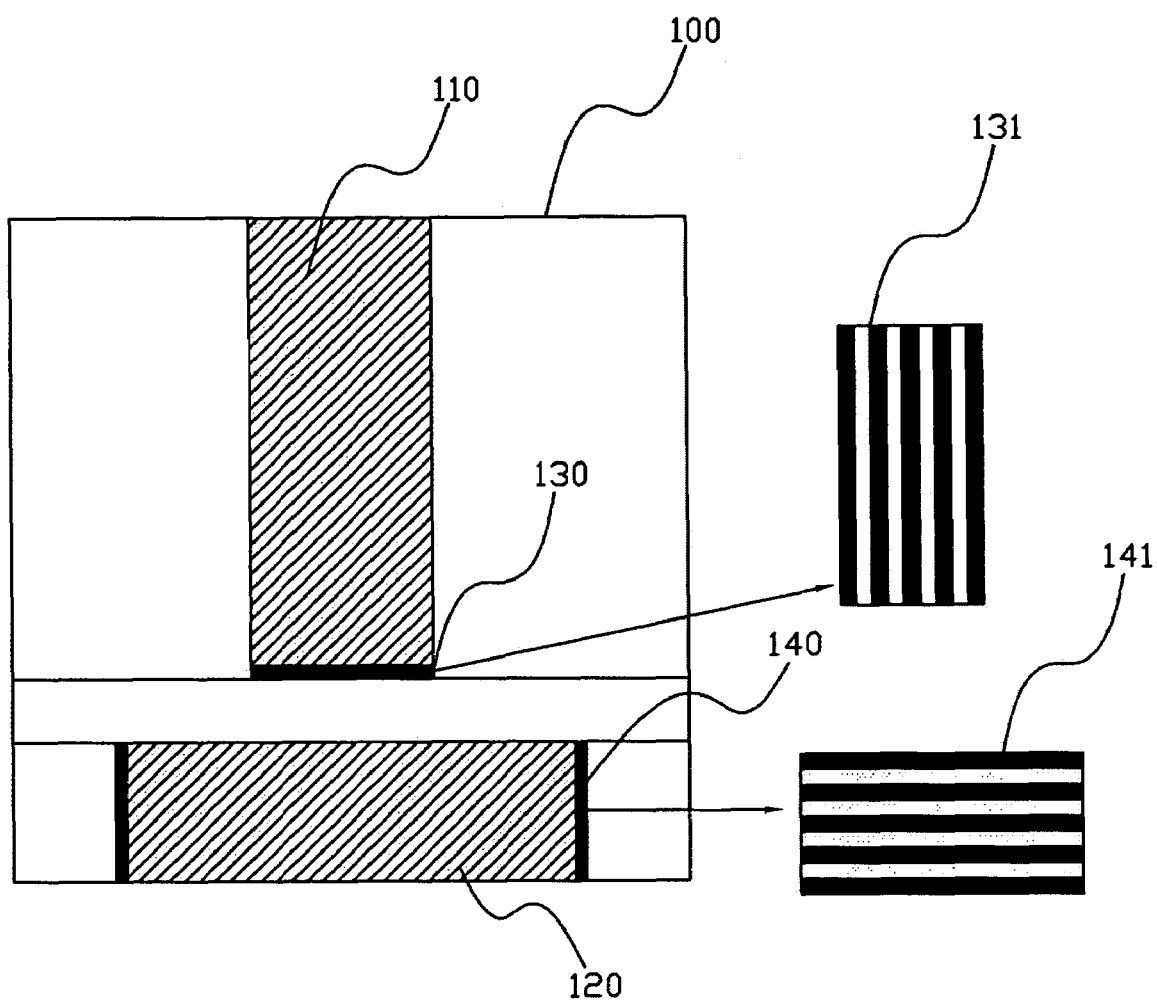
FIG. 2 illustrates an example photomask having a slit-type shadow pattern constructed in accordance with the teachings of the present invention.

FIG. 2 illustrates an example photomask having a slit type shadow pattern. Referring to FIG. 2, a first pattern 110 is positioned along one axis of a Cr-less mask 100. A second pattern 120 is positioned in the Cr-less mask 100 at a distance from, and at a predetermined angle to, the first pattern 110. The second pattern 120 may be one or more patterns. Slits 130 and 140 made of Cr are positioned on at least one end of each of the two patterns 110 and 120 to prevent unintended patterns from being formed in the mask 100. The slits 130, 140 comprise fine patterns. Each of the fine patterns has a narrower width than its corresponding pattern 110, 120. Each fine pattern placed in the slits 130, 140 is aligned in parallel with the longitudinal axis of the respective pattern 110 or 120. In other words, the fine slit pattern 131 for the vertical pattern 110 is also vertical, and the fine slit pattern 141 for the horizontal pattern 120 is also horizontal.

Accordingly, the Cr-less mask having a slit with fine patterns is useful to improve a resolution of the patterns 110, 120. Furthermore, the usage of conventional equipment for exposure can be prolonged and the development of next generation equipment for exposure can be accelerated.

It is noted that this patent claims priority from Korean Patent Application Serial Number 10-2003-0101206, which was filed on Dec. 31, 2004, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly within the scope of the appended claims either literally or under the doctrine of equivalents.

What is claimed is:

1. A photomask comprising:
   a first pattern disposed in alignment with a first axis of the photomask;
   at least one second pattern disposed at a distance from, and at a predetermined angle to, the first pattern; and
   slits made of Cr on at least one end of each of the first and second patterns,
   wherein the photomask is a Cr-less mask.

2. A photomask as defined by claim 1, wherein the slits comprise fine patterns, and each of the fine patterns has a narrower width than a corresponding one of the first and second patterns.

3. A photomask as defined by claim 2, wherein the fine patterns are aligned parallel to a longitudinal axis of a corresponding one of the first and second patterns.

* * * * *